United States Patent
Poelzl

(10) Patent No.: US 8,097,916 B2
(45) Date of Patent: Jan. 17, 2012

(54) METHOD FOR INSULATING A SEMICONDUCTING MATERIAL IN A TRENCH FROM A SUBSTRATE

(75) Inventor: Martin Poelzl, Ossiach (AT)

(73) Assignee: Infineon Technologies Austria AG, Villach (AT)

( * ) Notice: Subject to any disclaimer, the term of this patent is extended or adjusted under 35 U.S.C. 154(b) by 192 days.

(21) Appl. No.: 11/781,582

(22) Filed: Jul. 23, 2007

(65) Prior Publication Data

US 2009/0026531 A1     Jan. 29, 2009

(51) Int. Cl.
*H01L 29/66* (2006.01)
(52) U.S. Cl. ............ 257/330; 438/400; 257/E27.091
(58) Field of Classification Search .......... 438/400; 257/330, E27.091
See application file for complete search history.

(56) References Cited

U.S. PATENT DOCUMENTS

| 6,767,789 B1 * | 7/2004 | Bronner et al. ............... 438/254 |
| 6,916,745 B2 | 7/2005 | Herrick et al. |
| 2003/0203573 A1 * | 10/2003 | Nakamura et al. ............ 438/259 |
| 2005/0191794 A1 * | 9/2005 | Herrick et al. ................ 438/135 |
| 2006/0141739 A1 * | 6/2006 | Poelzl ............................ 438/424 |

* cited by examiner

*Primary Examiner* — Thao Le
*Assistant Examiner* — Matthew Gordon
(74) *Attorney, Agent, or Firm* — Dicke, Billig & Czaja, PLLC

(57) ABSTRACT

A method for insulating a semiconducting material in a trench from a substrate, wherein the trench is formed in the substrate and comprising an upper portion and a lower portion, the lower portion being lined with a first insulating layer and filled, at least partially, with a semiconducting material, comprises an isotropic etching of the substrate and the semiconducting material, and forming a second insulating layer in the trench, wherein the second insulating layer covers, at least partially, the substrate and the semiconducting material.

13 Claims, 12 Drawing Sheets

METHOD FOR INSULATING A SEMICONDUCTING MATERIAL IN A TRENCH FROM A SUBSTRATE

BACKGROUND OF THE INVENTION

The present invention relates to a method for insulating a semiconducting material in a trench from a substrate by isotropic etching and by means of forming an insulating layer, and to a device manufactured by same, having self-aligned features.

Manufacturing methods are necessary for the production of highly integrated semiconductor devices, which offer a high accuracy in order to fulfill the demanding production requirements. In order to reduce power loss during switching on operation of power semiconductor devices, i.e. trench transistors, the distance between neighboring devices should be minimized. In doing so, the silicon region comprising the transistor channel between the trenches is formed as small as possible. For this purpose, self-adjusting methods can be used in order to place the source/body contact of the transistor near to a trench and to still ensure a proper insulation between the source/body contact and the gate contact in the trench. Reduction of any of these dimensions without complicating the process technology is difficult to achieve.

Thus, a new approach wherein, for example, insulating the trench and the source/body contact and wherein the distance of the trench transistors can be reduced and a self-adjusted contact between the trenches can be formed without increasing the process complexity is desirable.

BRIEF SUMMARY OF THE INVENTION

In accordance with embodiments, the present invention provides a method for insulating a semiconducting material in a trench from a substrate, the trench being formed in the substrate and comprising an upper portion and a lower portion, the lower portion being lined with a first insulating layer and filled at least partially with a semiconducting material. The method comprises isotropic etching of the substrate and the semiconductor material, forming a second insulating layer in the trench, wherein the second insulating layer covers at least partially the substrate and the semiconducting material.

DETAILED DESCRIPTION

With reference to the accompanying FIGS. 1 to 15, explanations and embodiments relating to the method for insulating a semiconducting material in a trench from a substrate will be depicted in detail below.

Figure 1:
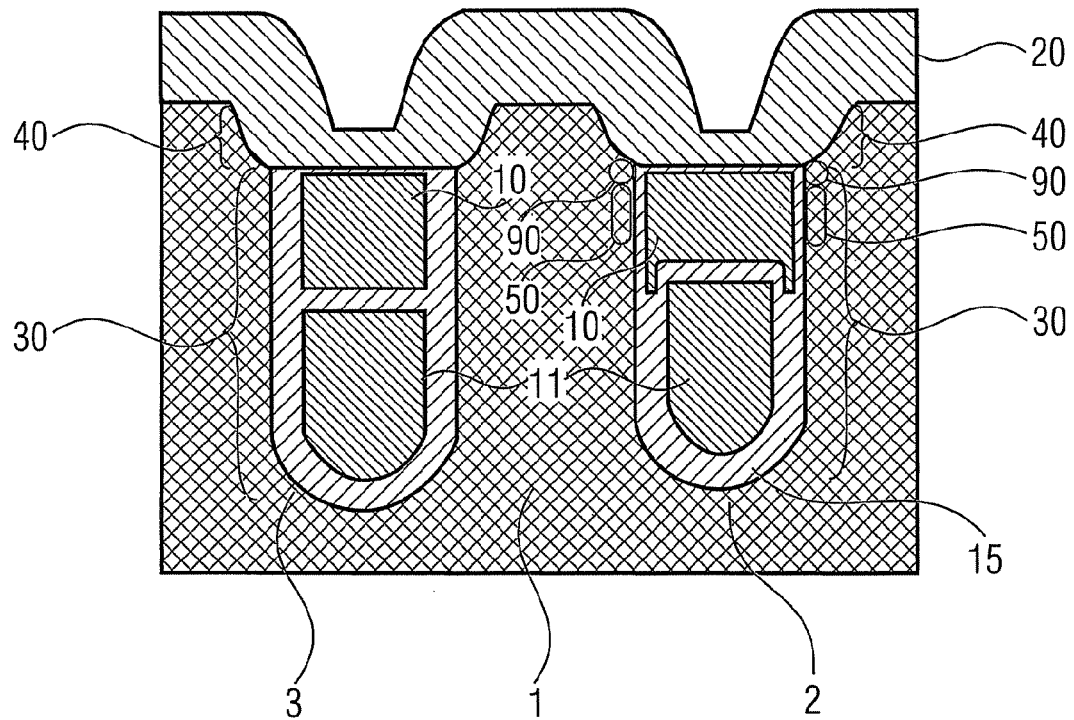
FIG. 1 shows a schematic cross-sectional view of a trench field-effect transistor (FET) with a thermal-grown postoxide spacer.

FIG. 1 shows a schematic cross-sectional view of a silicon substrate 1 comprising, two trenches, wherein a first trench is a cell field trench 2 and a second trench is a termination trench 3. Both trenches 2,3 comprise a lower portion 30 and an upper portion 40. The lower portion 30 of the trenches 2, 3 comprise two semiconducting regions formed as a gate electrode 10, comprising a double t-type shaped form, and another electrode 11. The cell field trench 2 is formed as a vertical trench metal oxide semiconductor field effect transistor (MOSFET), with the gate electrode 10 and the insulating layer 15 forming the gate oxide in the region of the gate electrode, the electrode 11, kept on a source potential, a source region 90, formed on each side of the trench 2, a channel region 50 formed on each side of the trench 2 and a drain region 7, formed by a substrate region. The termination trench 3 acts as a completion trench for a plurality of cell field trenches and does not comprise a working MOSFET structure.

The trenches 2,3 are lined with an insulating layer 15, which is also insulating the gate electrode 10 against the electrode 11 within the trenches. The upper portion 40 and the substrate 1 is covered by a thick thermal grown postoxide insulating layer 20. The postoxide layer 20 is forming a spacer and is insulating the gate electrode 10 and the substrate 1 against each other and against a subsequent deposition of conducting material on top of the postoxide insulating layer 20. The postoxide insulating layer 20, respectively the postoxide spacer has been formed in a high temperature process by transforming silicon at the surface of the substrate 1 and at the surface of the semiconducting region 10 in silicon oxide. Forming the postoxide insulating layer 20 in a high temperature step has some disadvantages for the operating parameter of the trench MOSFET. Due to the high temperature, which is necessary to form the postoxide insulating layer 20, a prior doping of the lower portion 30 of the trench MOSFET 2, in order to form the gate electrode 10, can be affected such that the doping atoms diffuse in the adjacent channel region 50 of trench MOSFET. For this reason, the forming of the postoxide spacer can not be performed for a p-channel trench MOSFET, whose gate electrode 10 has previously been realized by a boron implantation of the gate polysilicon material, forming the gate electrode 10 and electrode 11. The boron might diffuse during the process of forming the postoxide insulating layer 20 in the channel 50 of the trench MOSFET. This may lead to considerable fluctuations of the threshold voltage $V_{th}$ of the respective trench MOSFET. Furthermore, both at n- and p-channel trench MOSFETs, the high temperature budget for forming the postoxide spacer may lead to a more intense diffusion of the doping atoms out of the substrate. This may increase the fraction of the substrate 1 contributing to the switch-on resistance of the trench MOSFET.

Figure 2:
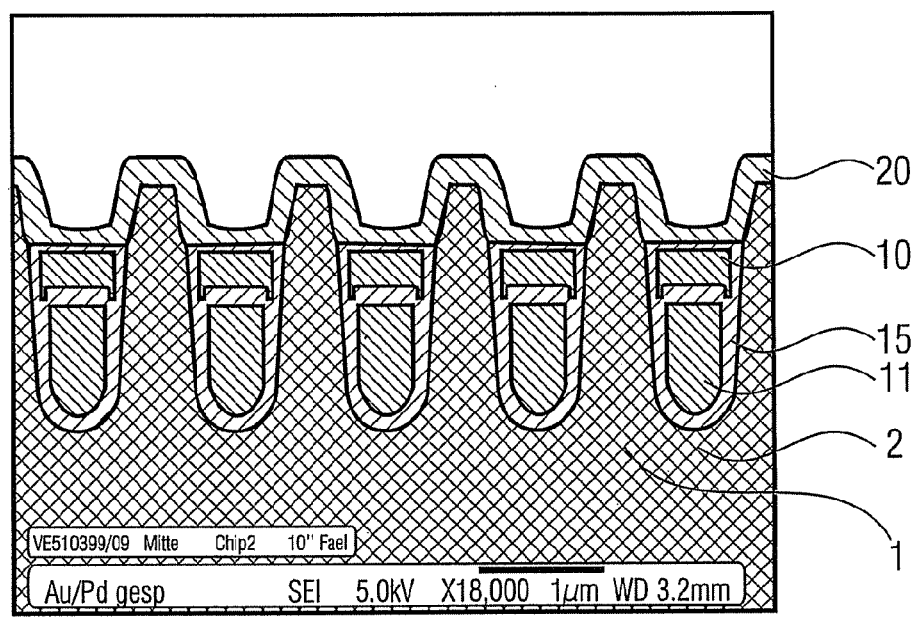
FIG. 2 shows a raster electron microscope (REM) picture of a plurality of trench FETs comprising the thermal-grown postoxide spacer.

FIG. 2 shows a plurality of trenches 2, wherein the semiconducting material 10 is insulated against the substrate 1 by the thermal-grown postoxide spacer 20.

Figure 3A:
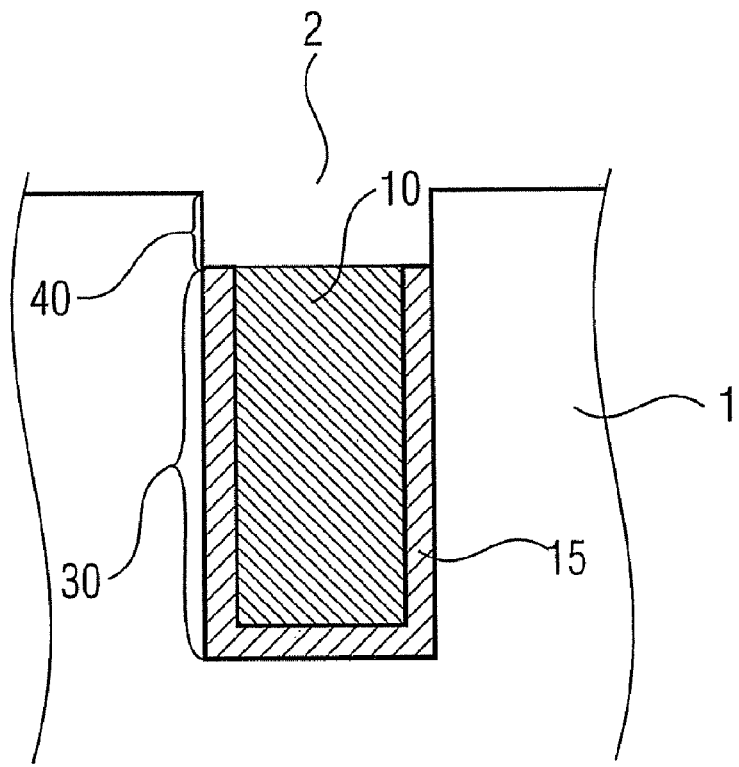
FIGS. 3a-c show the method for insulating a semiconducting material in a trench from a substrate in a sequence of drawings.
Figure 3B:
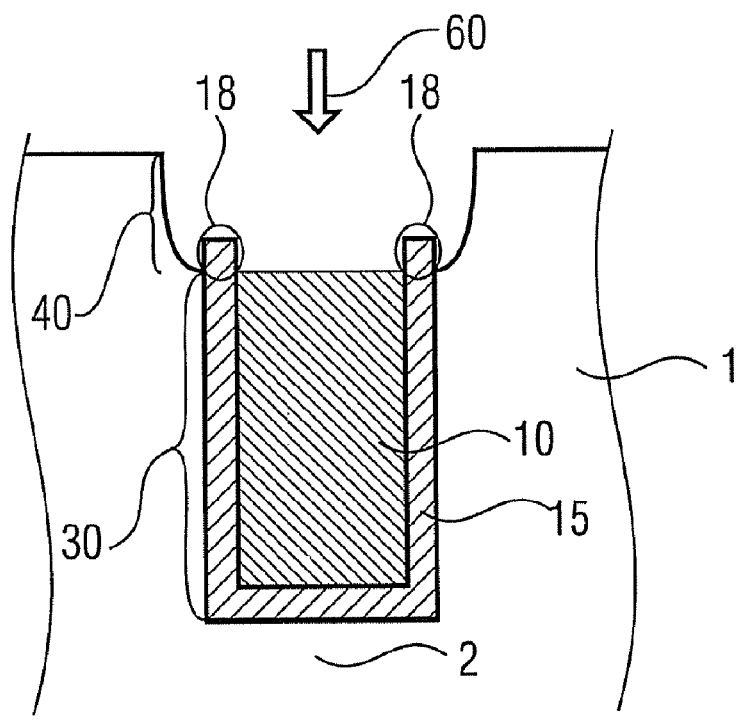
Figure 3C:
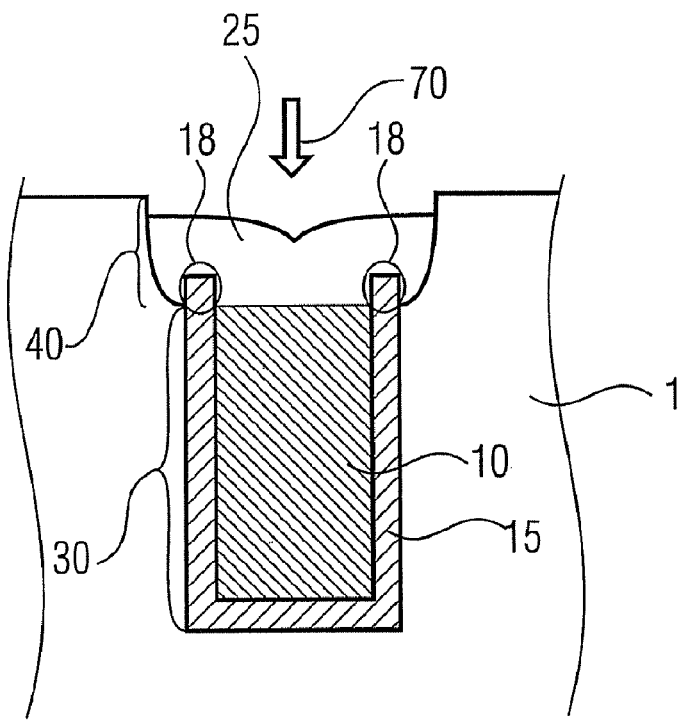

FIG. 3c shows a schematic cross-sectional view of a trench 2 fabricated with the method for insulating a semiconducting material 10 in a trench 2 against a substrate 1. The trench 2 is formed in the substrate 1, wherein the trench comprises an upper portion 40 and a lower portion 30, wherein the lower portion is lined with a first insulating layer 15 and filled at least partially with the semiconducting material 10. The first insulating layer 15 comprises a portion 18 extending into the upper portion 40. The substrate 1 at the upper portion 40 is insulated by a second insulating layer 25 from the semiconducting material 10 in the lower portion 30 of the trench 2.

FIGS. 3a-3c describe an embodiment of the method for insulating a semiconducting material 10 in a trench 2 from a substrate 1. Starting structure of the method, shown in FIG. 3a, is a trench 2 in a substrate 1, wherein the trench 2 comprises an upper portion 40 and a lower portion 30, wherein the lower portion 30 is lined with a first insulating layer 15 and filled at least partially with the semiconducting material 10. The trench 2, as described above may be formed in different ways and may describe the state of a semiconductor device at a certain production step. Furthermore, the described trench may be part of different semiconductor devices and, therefore manufactured and processed in different ways. The trench 2 may be formed for example, within the production process for a trench MOSFET, an insulated gate bipolar transistor (IGBT), a Schottky-diode and such like semiconductor devices. The substrate 1 and/or the semiconducting material 10 can be identical and may, for example, comprise silicon, polysilicon, amorphous silicon, silicon carbide, gallium arsenide, indium phosphide or any other material which is used for producing semiconductor devices. The semiconducting material 10 in the lower portion 30 of the trench 2 can, for example, comprise polysilicon, which can be in-situ doped or doped in a consecutive implantation. Therefore, the semiconducting material 10 may comprise boron doping atoms for a p-type doping or, in the case of a n-type doping, arsenic, phosphorus or antimony doping atoms.

The first insulating layer 15, which lines the lower portion 30 of the trench 2, can comprise, for example, silicon oxide, silicon nitride or any other insulating material used to fabricate a semiconductor device. The lower portion 30 of the trench 2 may, for example, comprise a wall and a bottom and the above-mentioned first insulating layer 15 may only line the wall of the lower portion 30 of the trench 2. The lower portion 30 of the trench 2 may comprise several structures, for example, two semiconducting electrodes 10 and 11, as it is shown in FIG. 1, for fulfilling certain tasks in a semiconductor device.

As depicted in FIG. 3b, the substrate 1 and the semiconducting material 10 is isotropically etched 60 such that the lateral dimension of the upper portion 40 of the trench 2 is enlarged compared to the lateral dimension of the lower portion 30 of the trench 2. A spacer is formed by the isotropic etching 60. The isotropic etching 60 of the substrate 1 and the semiconducting material 10 does not, or almost not, etch the first insulating layer 15. As a consequence, a portion 18 of the first insulating layer 15 may extend into the upper portion 40.

The exact lateral dimension of the upper portion 40, respectively of the spacer and the portion 18 of the first insulating layer 15 extending into the upper portion 40 of the trench 2 depends on the precise condition of the isotropic etching, the employed substrate material, the semiconducting material and the employed first insulating material. The etching process may depend on the etching medium, etching time, and etching factor, which the respective material comprises. The first insulating layer 15 should comprise a different etching selectivity against the used etching medium in order to be not, or almost not etched. The exact dimensions of the spacer and the portion 18 of the first insulating layer extending into the upper portion 40 can be tuned to the needs required to produce a certain semiconductor element or device. The etching can be performed with conventional means, for example, with dry etching or wet etching, as it is employed in the semiconductor process technology. In order to achieve isotropic etching, the substrate and the semiconducting material may be identical or comprise a similar chemical composition. For producing a trench MOSFET the substrate 1 may comprise silicon and the semiconducting material 10 may, for example, comprise polysilicon doped with boron atoms in order to form the gate electrode, and the first insulating layer 15 may comprise silicon oxide. By isotropic etching the silicon substrate directly after the definition and forming of the gate electrode in the semiconducting material 10, a precise spacer may be formed without performing any high temperature step, which could affect the doping of the gate electrode or the substrate. In modern silicon etching systems a pitch of 100 nm with a variation smaller than 7 nm can be reached. Since the spacer is formed after the definition of the gate electrode without performing any high temperature step, the described method offers the possibility of realizing a boron doped gate electrode, in-situ-doped respectively implanted after the polysilicon deposition.

FIG. 3c depicts the forming 70 of a second insulating layer 25 in the trench 2, wherein the second insulating layer 25 covers at least partially the substrate 1 in the upper portion and the semiconducting material 10.

The second insulating layer 25 can comprise an identical material like the first insulating layer 15. The second insulating layer may, for example, comprise at least one of the consecutive materials: Silicon oxide, silicon nitride, phosphorus silicate glass, boron phosphorus silicate glass, polymeric or organic material. Forming the second insulating layer 25 can be done in a conventional way, which is appropriate for the respective semiconductor process technology.

Figure 4:
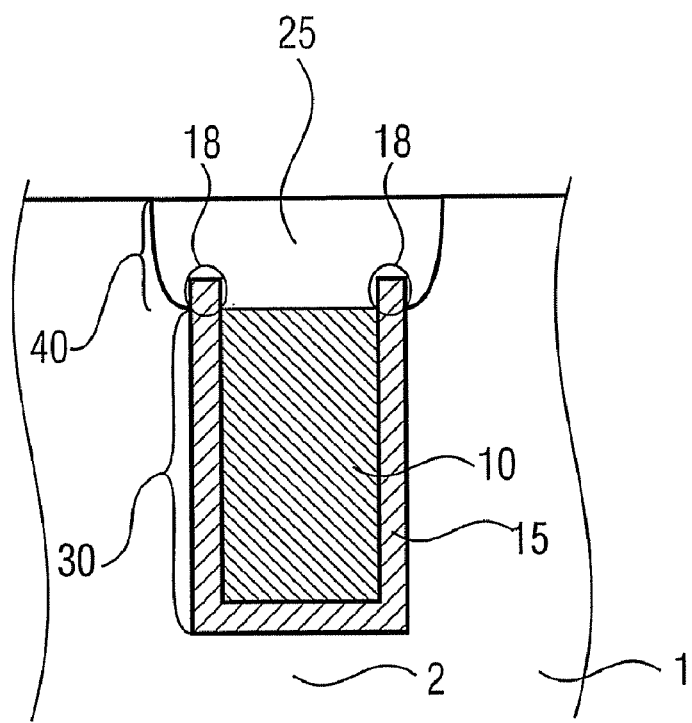
FIG. 4 shows another embodiment of forming a second insulating layer in the trench.
Figure 5:
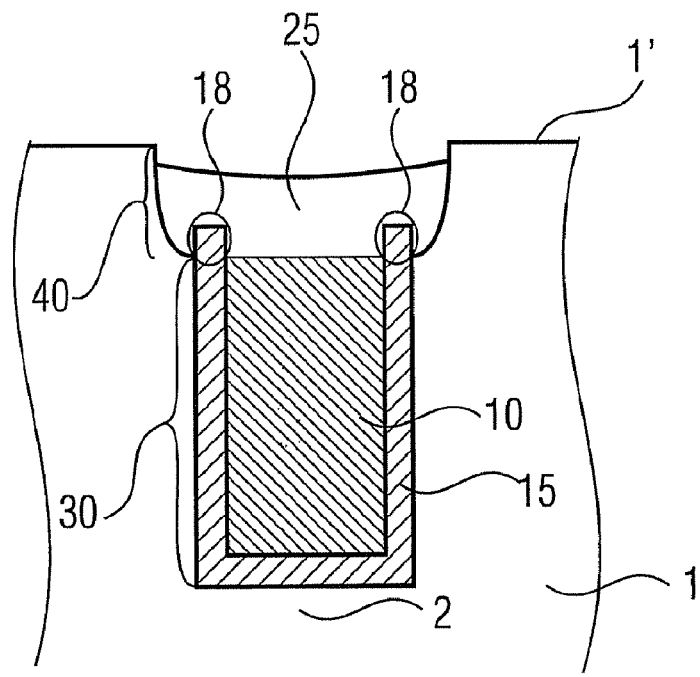
FIG. 5 shows another embodiment of forming a second insulating layer in the trench.

The second insulating layer 25 can be formed in different ways. FIG. 4 shows, for example, a completely filled upper portion 40 of the trench 2, with the second insulating layer 25. FIG. 5 depicts another embodiment, wherein the upper portion 40 is almost completely filled, up to the substrate surface 1', with the insulating layer 25.

Figure 6:
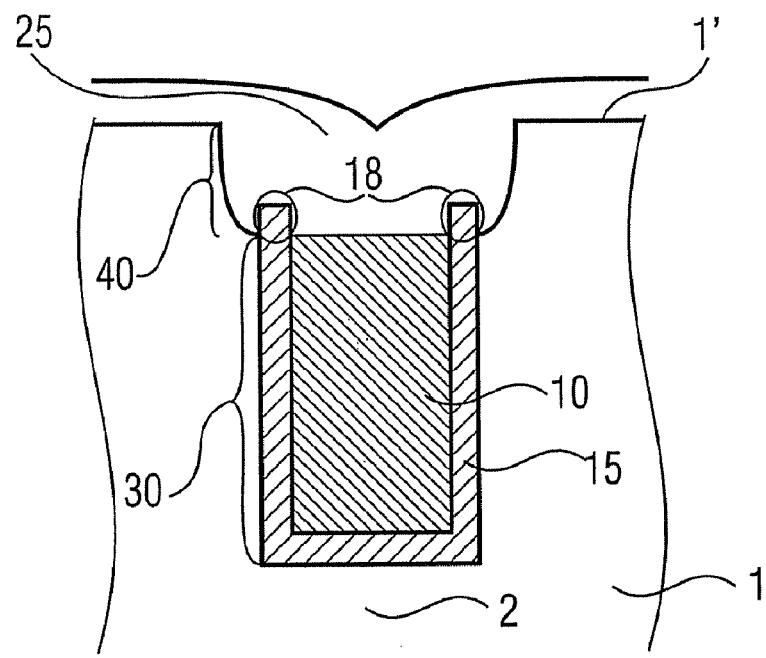
FIG. 6 shows another embodiment of forming a second insulating layer in the trench.

Forming the second insulating layer 25 can be an interlevel dielectric (ILD) filling with respective materials. This can be done, for example, by using a mask or, as it is shown in FIG. 6, in such a way that the second insulating layer 25 covers at least partially the surface 1' of the substrate.

Figure 7:
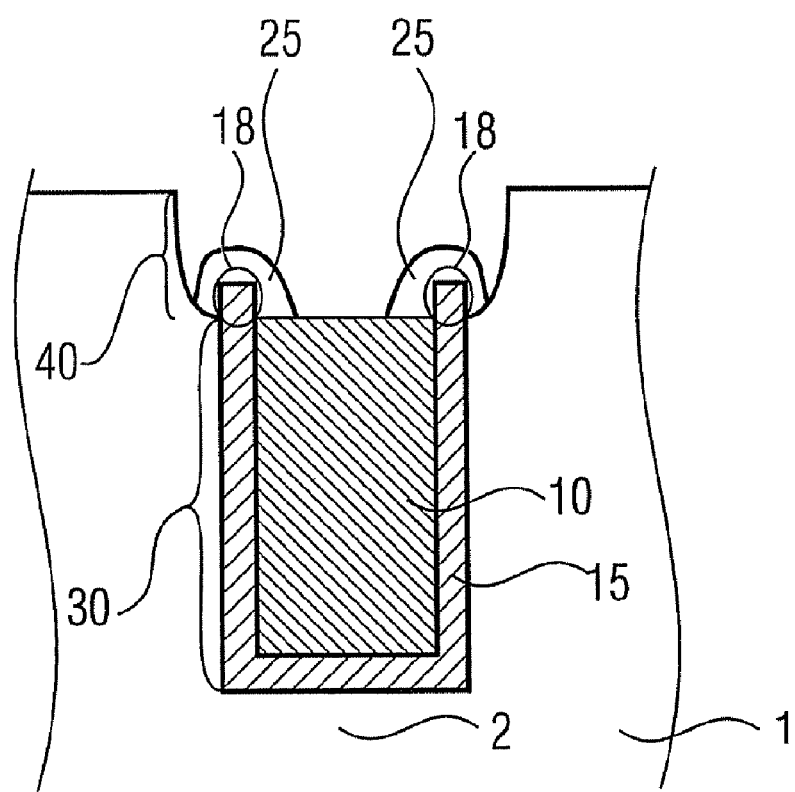
FIG. 7 shows another embodiment of forming a second insulating layer in the trench.

The second insulating layer 25 in the trench may be formed such that only a part of the semiconducting material 10 and the adjacent substrate 1 in the upper portion 40 of the trench 2 is insulated (see FIG. 7). The forming of the second insulating layer in the trench may be performed such that the sidewalls of the upper portion are at least partially covered as well as the semiconducting material 10.

Figure 8:
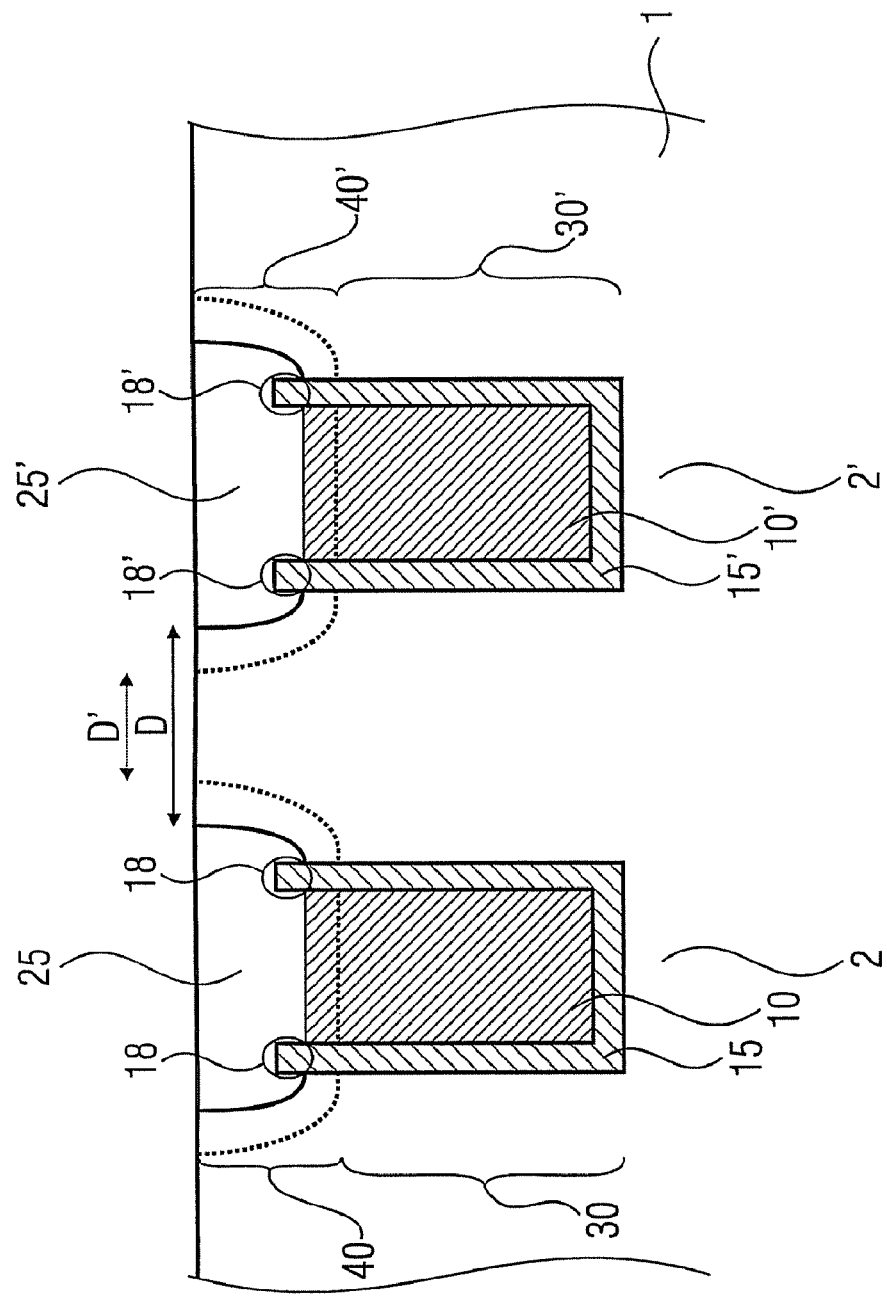
FIG. 8 shows another embodiment for the method for insulating a semiconductor material in a trench from a substrate with two trenches.

FIG. 8 shows another embodiment of the present invention, wherein the substrate 1 comprises a further structure. In FIG.

8, for example, a second trench 2', with an upper portion 40', a lower portion 30', a semiconducting material 10', a first insulating layer 15', a second insulating layer 25' and a portion 18' of the first insulating layer extending into the upper portion 40' of the trench 2'. Both trenches 2 and 2' are identical and fabricated according to the above-mentioned method for insulating a semiconducting material in a trench from a substrate. The distance D between both trenches 2, 2', respectively D' as it is indicated in FIG. 8 with dotted lines, can be controlled by the above-mentioned isotropic etching 60. For example, the dotted lines for the upper portion 40, 40' refer to a longer isotropic etching 60 and therefore to a smaller distance D' between the trenches 2 and the 2'. This means that the distance between the trenches can be easily and precisely controlled. It is also possible to control the distance D against a further structure, which is here not described in detail, instead against a second trench 2'.

Figure 9:
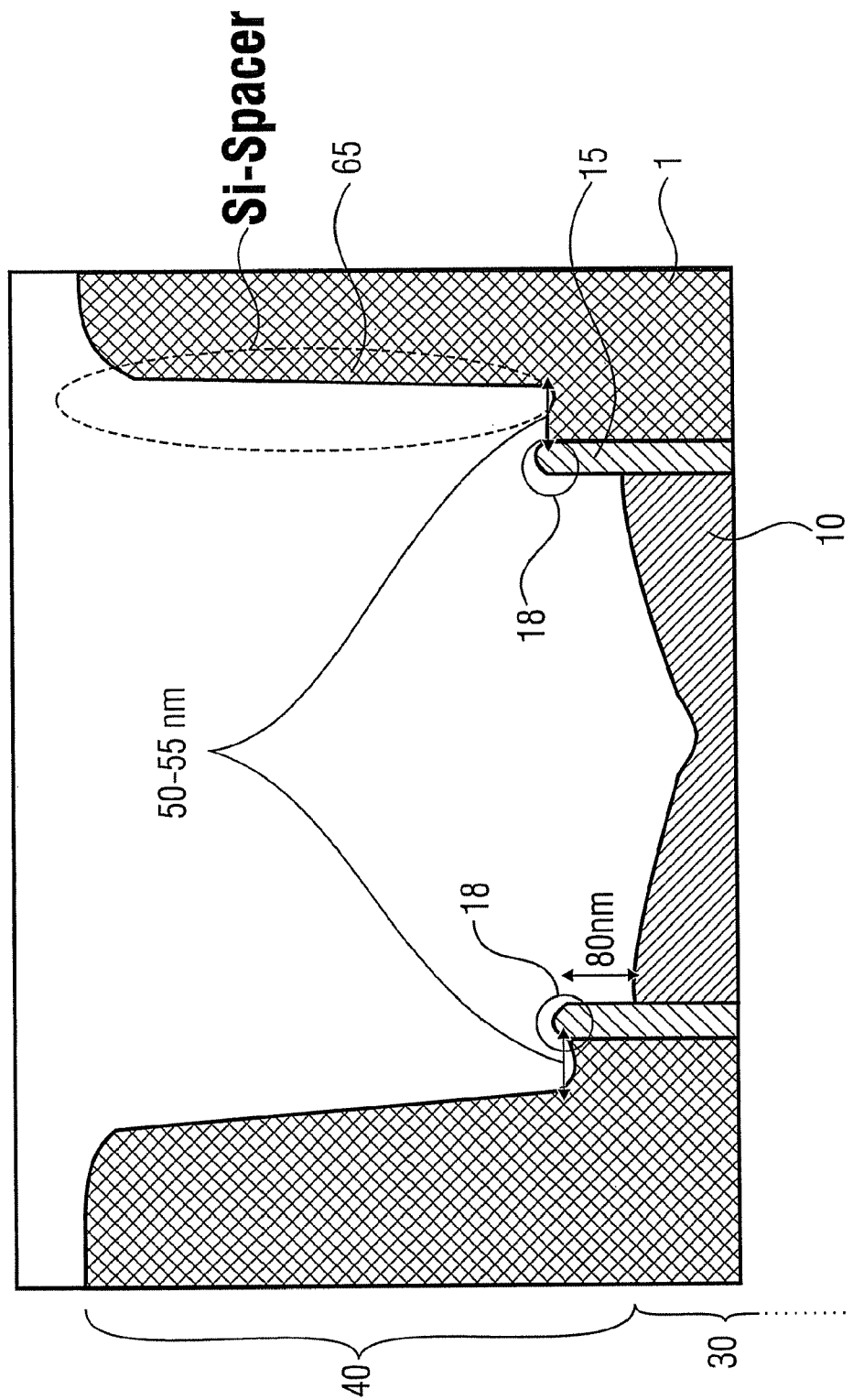
FIG. 9 shows a REM picture of the upper portion of a trench after isotropic etching.
Figure 10:
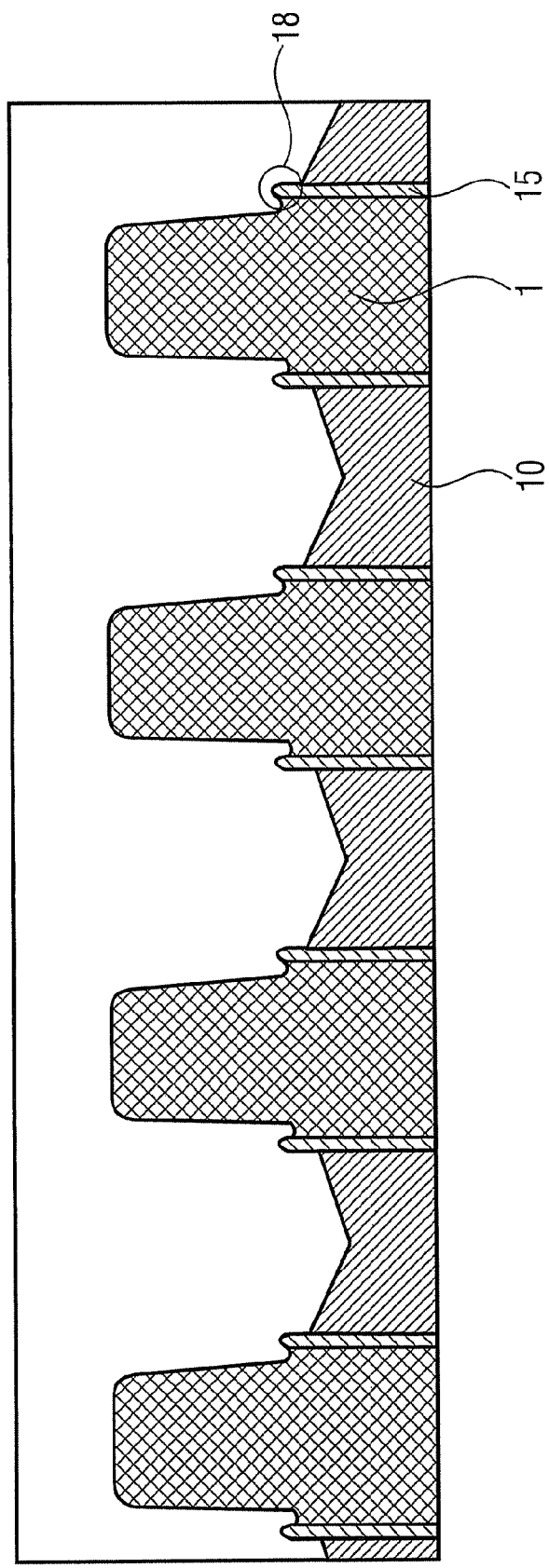
FIG. 10 shows an upper portion of a plurality of trenches after isotropic etching.

The REM pictures in FIGS. 9 and 10 show, in more detail, the situation after isotropic etching one trench (FIG. 9) and a plurality of trenches (FIG. 10). The lateral dimension of the upper portion 40 in FIG. 9 is, in this case, on each sidewall of the trench enlarged by 50 nm to 55 nm. The semiconducting material 10 in the lower portion 30 of the trench is approximately 80 nm ablated. The portion 18 of the first insulating layer 15, extending into the upper portion 40, is formed, in contrast to the schematic figures (for example FIG. 7), in a way where the abrasive on both sides of the insulating layer 15 may not be equal. By isotropic etching, the schematic depicted spacer 65 can be formed at the sidewall of the upper portion 40 of the trench, as it is schematically shown in FIG. 9.

Figure 11:
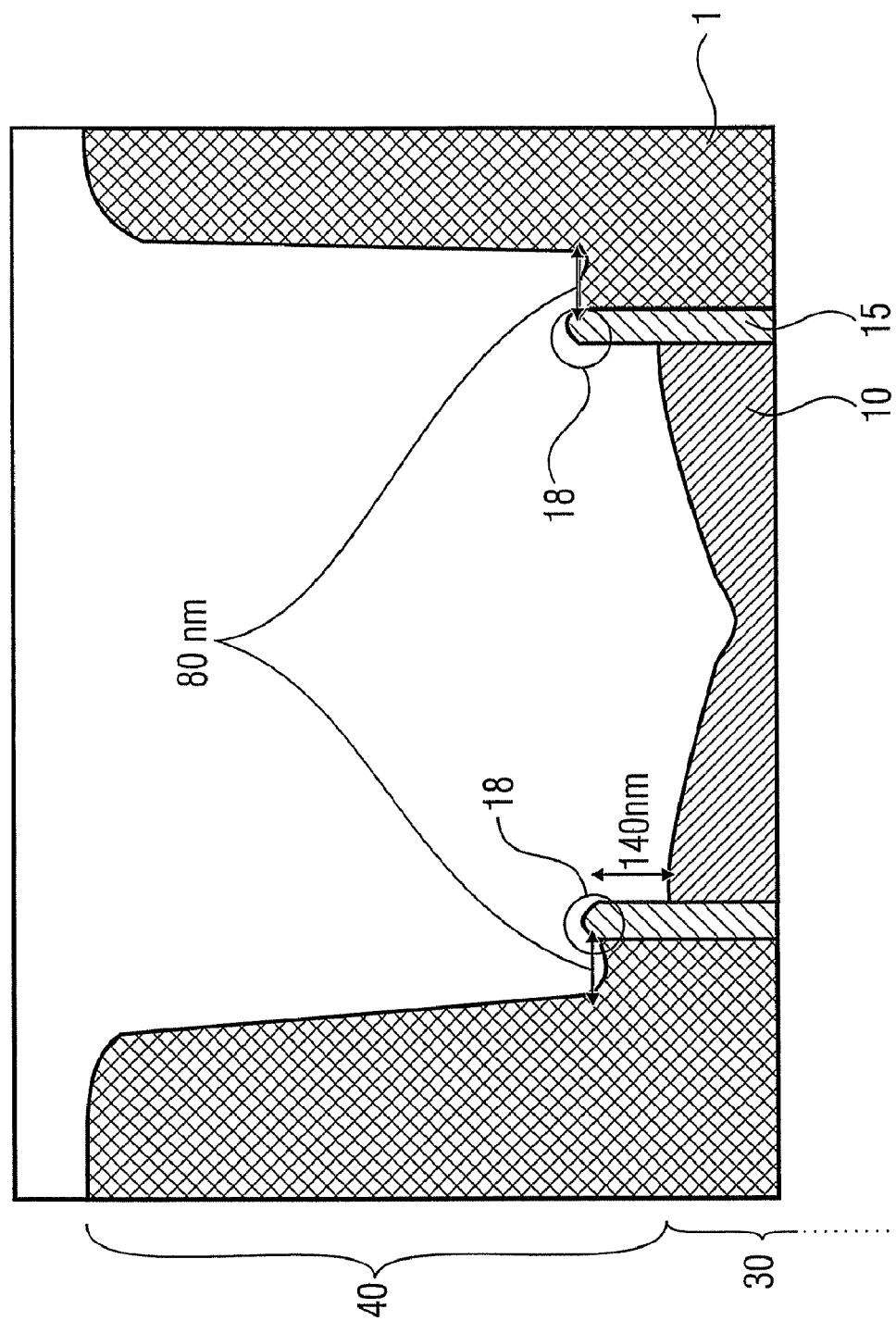
FIG. 11 shows an upper portion of a trench after a longer isotropic etching.
Figure 12:
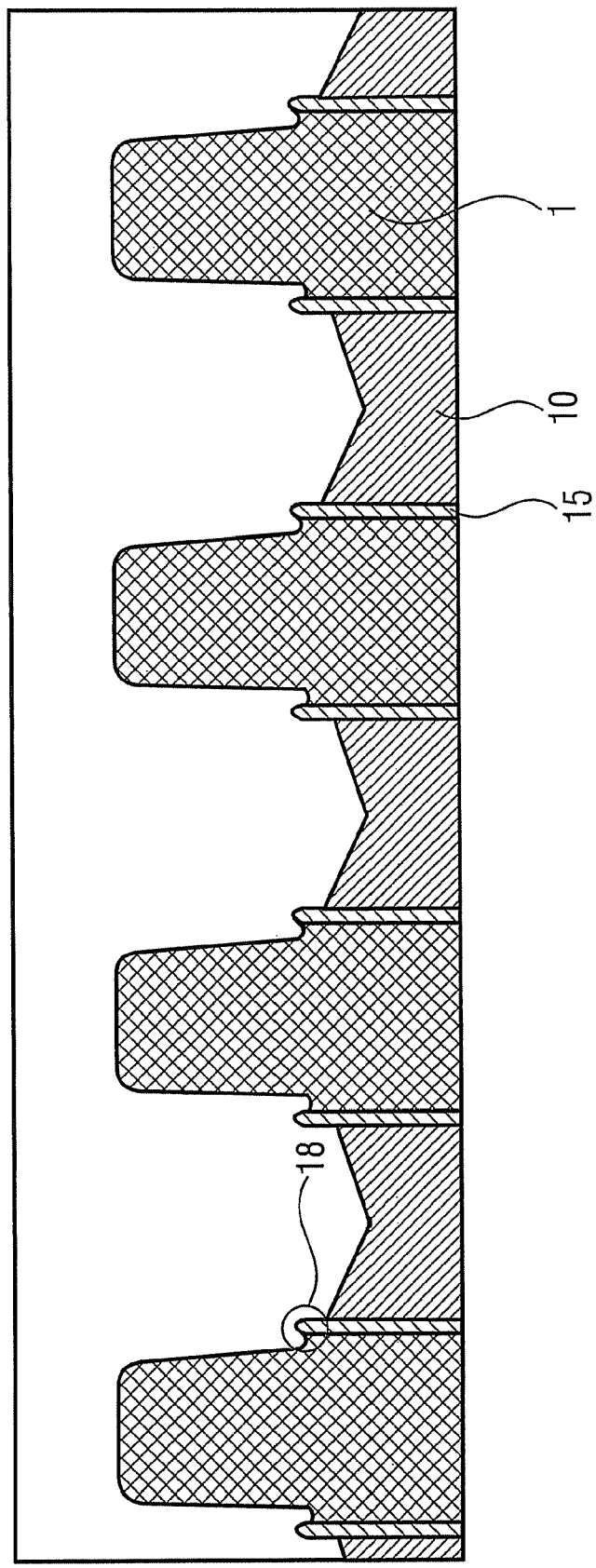
FIG. 12 shows an upper portion of a plurality of trenches, after a longer isotropic etching.

FIGS. 11 and 12 depict the same structures as in FIGS. 9 and 10, but with a longer isotropic etching time, leading to a further enlargement of the lateral dimension of the upper portion 40, in this case, at approximately 80 nm on each sidewall of the trench and a vertical abrasive in the trench at about 140 nm.

FIGS. 9 to 12 show that the isotropic etching can be precisely performed and, therefore, the width of the spacer and the distance between further structures, in this case further trenches, can be adjusted to the respective needs of the semiconductor device.

Figure 13:
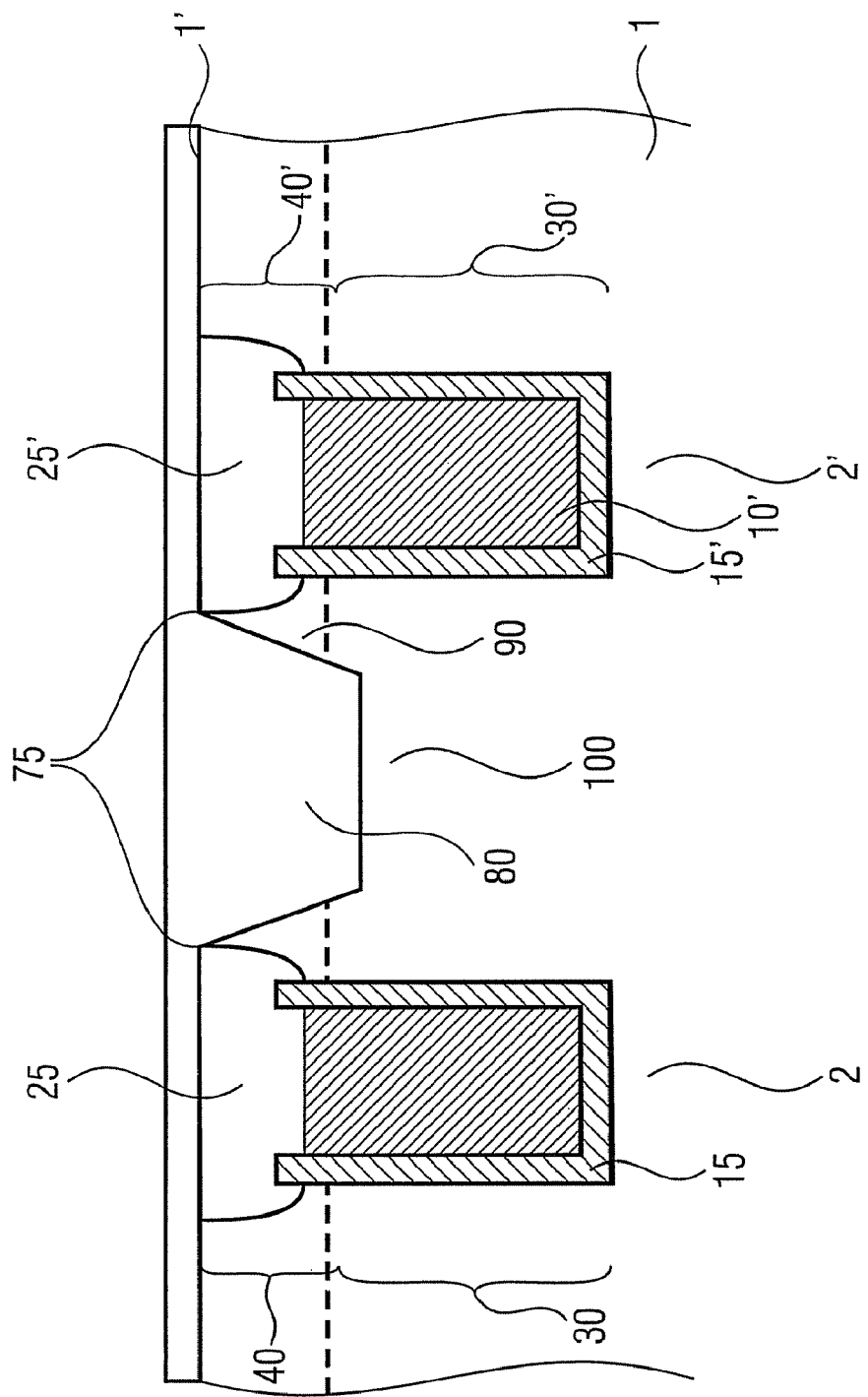
FIG. 13 shows a self-adjusted contact between two trenches insulate d by the method for insulating a semiconducting material in a trench from a substrate.

FIG. 13 shows two trenches 2, 2' in a certain distance adjusted by isotropic etching. Both trenches are filled with the second insulating layer 25, 25' in the upper portion 40, 40'. After forming the second insulating layer in the trenches, a contact hole 75 between the two second insulating layers 25, 25', respectively the spacers formed therewith may be formed by means of conventional etching. Afterwards, the contact hole 75 can be filled or covered with a conducting material 80 in order to form a contact to, or an electrode in the substrate 1 between the two trenches 2 and 2'. It should be mentioned that, for example in the case of the trench MOSFET, the upper fraction 90 of the substrate 1 between the trenches may be formed as a source region and, therefore, a source contact is formed in the region 90 and a lower fraction of the substrate 1 may be formed as a body contact in a body region 100. Depending on the way as to how the forming of the second insulating layer was performed and as to whether the surface 1' of the substrate was covered with the second insulating layer 25, it might be necessary to first remove the second insulating layer 25 down to the surface 1' of the substrate before etching the contact hole 75 and forming the contact with conducting material 80. If necessary, the removal of the second insulating layer 25 may be done by conventional means of etching, polishing or smoothing. For a proper function of the trench MOSFET, it may be important that the distance D between the trenches and the contact can be precisely adjusted. This can be achieved with the above-explained method for insulating a semiconducting material in a trench from a substrate, by forming a self-adjusted contact between two trench MOSFET. Self-adjusted means that no further mask step is needed to define the contact hole. This can be achieved by a proper isotropic etching 60 and a forming a proper second insulating layer 25. It is clear, that the forming of the contact hole and the forming of the contact can be done in parallel for a plurality of trenches, as it is indicated by FIGS. 10 and 12 showing a plurality of trenches in parallel.

Figure 14:
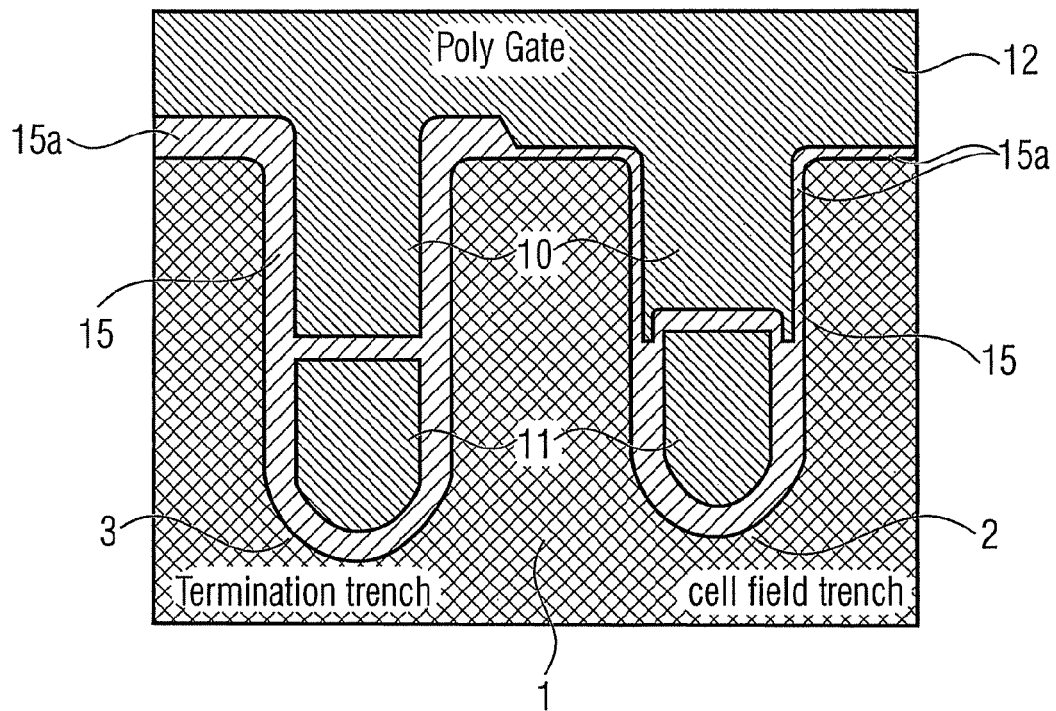
FIG. 14 shows another embodiment with a termination trench and a cell field trench after polysilicon deposition for the gate electrode.
Figure 15:
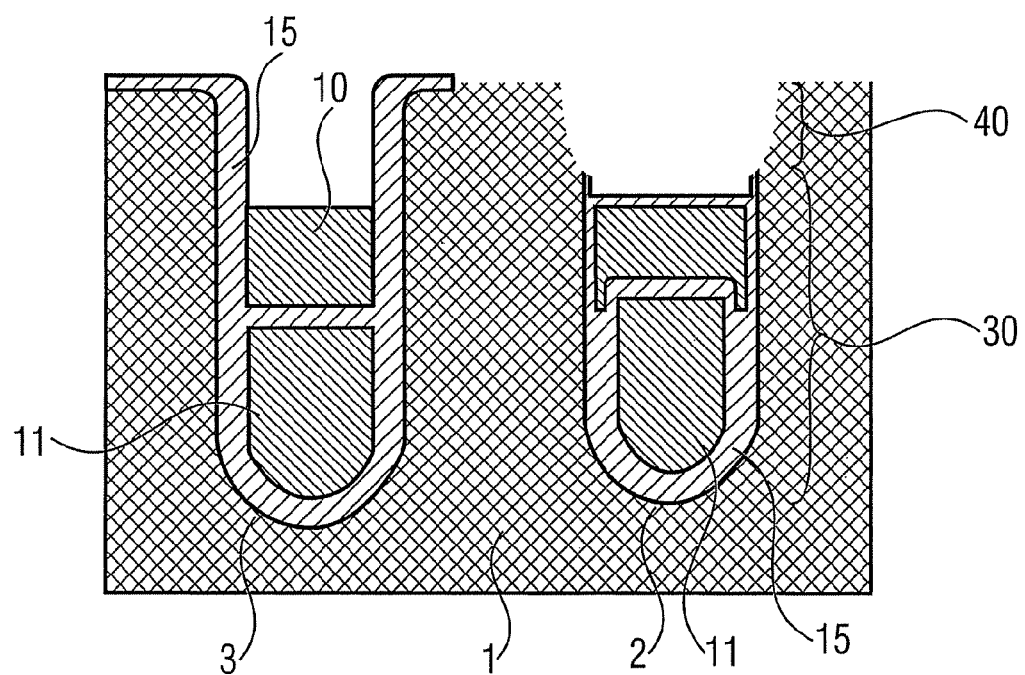
FIG. 15 shows a termination trench and the cell field trench after isotropic etching.

FIGS. 14 and 15 show a termination trench 3 and a cell field trench 2. In FIG. 14 both trenches and the surface of the substrate 1 are lined with a first insulating layer 15, wherein the insulating layer 15 is thicker at the upper portion of the termination trench 3. Furthermore both trenches 2,3 comprise a semiconducting region 11 insulated from a semiconducting region 10. FIG. 14 shows both trenches 2,3 after the deposition of polysilicon 12 in order to form the gate electrode 10 in the cell field trench 2. The polysilicon gate material 12 can be in-situ boron doped or doped by a following implantation of doping atoms. The excess polysilicon gate material 12 at the top of the trenches 2,3 can be removed by means of conventional polysilicon photolithography techniques and a subsequent polysilicon gate material 12 recess etching. After removing the excess polysilicon gate material 12, some first insulating layer 15a might be left on the sidewalls of the upper portion 40 of the trenches 2,3 and on the top of the cell field trench 2. This residual oxide may be removed by conventional means of etching, such that the starting trench of the method for insulating a semiconducting material in a trench from a substrate, as it is shown in FIG. 3a can be created. It should be noted that there are different ways for forming the above-mentioned starting trench.

FIG. 15 depicts a situation after performing the isotropic etching to the termination trench 3 and the cell field trench 2. The upper portion of the termination trench 3 is still protected with a first insulating layer 15 and, therefore, the substrate 1 adjacent to the upper portion of the termination trench may be not removed. In contrast, in the upper portion 40 of the cell field trench 2 the above-mentioned spacer can be formed. The isotropic silicon etching can be done for a certain time in order to reach a certain adjustment of the spacer. After the isotropic etching, an interlevel dielectric filling may be performed and, if necessary, a subsequent oxide recess step to remove the excess oxide from the interlevel dielectric filling on top of the surface of the substrate. In a consecutive step, a self-adjusted contact hole may now be etched between two trenches and filled with a conducting material.

In the case of a trench MOSFET, a contact to the above-mentioned source and bulk region in the substrate between two trenches, may be formed thereby. By isotropic etching and forming a second insulating layer a spacer can be formed between the trenches and the source/body contact. This way to form the spacer and the self-adjusted contact hole may avoid the high temperature step to form a thermal-grown postoxide insulating layer and, as a consequence, allow an in-situ p-doping of the gate electrode, without to cause a significant larger variation in the distance between the trenches and the source/body contacts.

The above-mentioned invention is not only restricted to trench MOSFETs, but can also be employed with other semiconductor structures and semiconductor devices to form, for example, a self-adjusted contact hole, an insulator between a semiconducting material in a trench and a substrate, respectively a spacer.

The electrode 11 in the lower portion of the trench, for example, in FIGS. 14 and 15 may be formed as a field plate, which may be kept at the same potential as the source of the trench MOSFET. The channel of the trench MOSFET can be formed radical adjacent to the lower portion of the trench, wherein, for example, the drain region might be formed in a lower portion of the substrate. The substrate may be n- or p-doped depending on the MOSFET being formed. The substrate may comprise different zones, with a different doping concentration in order to form, for example, a source region, which can then be contacted via a contact hole between two trenches, formed with the method described above.

What is claimed is:

1. A method for insulating a semiconducting material in a trench from a substrate, the trench being formed in the substrate and comprising an upper portion and a lower portion, the lower portion being lined with a first insulating layer and filled, at least partially, with a semiconducting material, the method comprising:
simultaneously isotropic etching the substrate and the semiconducting material so that the etch is selective to the first insulating layer and the first insulating layer has a top surface above a surface of the semiconducting material; and
forming a second insulating layer in the trench, the second insulating layer covering, at least partially, the substrate and the semiconducting material.

2. The method as claimed in claim 1, wherein the substrate comprises a further structure laterally shifted to the trench and wherein the distance between the trench and the further structure is controlled by the isotropic etching.

3. The method as claimed in claim 2, wherein the further structure is a second trench.

4. The method as claimed in claim 3, further comprising forming a contact hole in the substrate between the trench and the second trench and covering at least the contact hole with a conducting material.

5. The method as claimed in claim 1, wherein the forming of the second insulating layer in the trench is performed such that the second insulating layer covering, at least partially, the side walls of the upper portion and the semiconducting material.

6. The method as claimed in claim 1, wherein the forming of the second insulating layer in the trench is performed such that the upper portion is filled.

7. The method as claimed in claim 1, wherein the lower portion comprises a wall and a bottom, and the first insulating layer lining the wall of the lower portion.

8. The method as claimed in claim 1, wherein the substrate and/or the semiconducting material comprising at least one of the consecutive materials: Silicon, polysilicon, amorphous silicon, silicon carbide, gallium arsenide, and indium phosphide.

9. The method as claimed in claim 1, wherein the first and/or the second insulating layer comprising at least one of the consecutive materials: Silicon oxide, silicon nitride, phosphorus silicate glass, boron phosphorus silicate glass, polymeric or organic materials.

10. A method for insulating a semiconducting material of a semiconductor device in a trench from a substrate, the trench being formed in the substrate and comprising an upper portion and a lower portion, the lower portion being lined as a first insulating layer and filled, at least partially, with a semiconducting material, forming an at least first electrode, the method comprising:
simultaneously isotropic etching the substrate and the semiconducting material so that the etch is selective to the first insulating material and the first insulating layer has a top surface above a surface of the semiconducting material;
forming a second insulating layer in the trench, the second insulating layer covering, at least partially, the substrate and the semiconducting material, and
forming an at least second electrode in the substrate.

11. The method of claim 10, wherein the forming of the second insulating layer in the trench is performed such that the second insulating layer covers, at least partially, the 10 sidewalls of the upper portion and the semiconducting material, forming an at least first electrode.

12. The method of claim 10, wherein the forming of the second insulating layer in the trench is performed such that the upper portion is filled.

13. The method as claimed in claim 10, wherein the substrate comprises a second trench laterally shifted to the trench and wherein the distance between the trench and the second trench is controlled by the isotropically etching and the method further comprising:
forming a contact hole in the substrate between the trench and the second trench, and
forming the at least second electrode in the substrate by covering at least the contact hole with a conducting material.

* * * * *